(12) United States Patent
Heimbigner et al.

(10) Patent No.: US 6,233,554 B1
(45) Date of Patent: May 15, 2001

(54) AUDIO CODEC WITH AGC CONTROLLED BY A VOCODER

(75) Inventors: Wade L. Heimbigner, Poway; James A. Hutchison, IV; Louis D. Oliveira, both of San Diego, all of CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 08/989,743

(22) Filed: Dec. 12, 1997

(51) Int. Cl.$^7$ .................................................. G10L 19/14
(52) U.S. Cl. .............................................................. 704/225
(58) Field of Search ................................................ 704/225

(56) References Cited

U.S. PATENT DOCUMENTS 5,117,228 * 5/1992 Fuchigama ........................... 341/200
5,677,962    10/1997 Harrison et al. ...................... 381/109

OTHER PUBLICATIONS

"Voice–Band Audio Processors Application Report"; TCM320ACxx (5–V Versions), TLV320ACxx (3–V Versions); SLWA001, Jun. 1996; Texas Instruments.

"TCM320AC3x/4x Voice–Band Audio Processors—Application Report"; SPRA146, Oct. 1994; Greg Davis, Russ McDonald, Advanced Linear Applications—Semiconductor Group; Texas Instruments.

* cited by examiner

Primary Examiner—Fan Tsang
Assistant Examiner—Michael N. Opsasnick
(74) Attorney, Agent, or Firm—Philip R. Wadsworth; Charles D. Brown

(57) ABSTRACT

An audio band processor and a method and circuit for controlling its gain. The audio band processor comprises a first variable gain amplifier for receiving an analog audio signal; an analog to digital converter for converting the analog audio signal to a digital audio signal; and an interface circuit for encoding the digital audio signal. The interface circuit also arranges the digital audio signal into a sequence of encoded transmit frames, and receives a sequence of encoded receive frames, each receive frame comprising a predetermined number of encoded digital audio signal data bits and a predetermined number of digital gain control bits. The interface circuit also adjusts a gain level of the first variable gain amplifier in response to the digital gain control bits. In another embodiment, the audio band processor further comprises a second variable gain amplifier, and the interface circuit adjusts a gain level of the second variable gain amplifier in response to the digital gain control bits.

4 Claims, 2 Drawing Sheets

AUDIO CODEC WITH AGC CONTROLLED BY A VOCODER

BACKGROUND OF THE INVENTION

I. Field of the Invention

The present invention relates to audio band encoders and decoders. More particularly, the present invention relates to a novel and improved audio band encoder/decoder (CODEC) with an internal amplifier which is gain controlled by a voice encoder/decoder (VOCODER).

II. Description of the Related Art

In the art of digital audio processing, an audio band encoder/decoder (CODEC) is typically used to convert analog audio signals to encoded digital signals, and vice-versa. For example, the CODEC may receive the analog output of a microphone, and convert the microphone-generated analog audio signal into a Pulse Code Modulation (PCM) encoded digital audio signal for further digital signal processing in a digital signal processor (DSP). Additionally, the CODEC may receive a PCM-encoded digital audio signal from the DSP and convert it to an analog audio signal for use by an audio speaker. Of course, the CODEC may use additional digital encoding techniques as are known in the art, such as A-law, μ-law, or the like, or may merely use any other linear or non-linear encoding techniques.

A typical CODEC as known in the art may include an internal or more likely, an external audio amplifier of fixed or variable gain. The analog audio signal from the microphone is amplified by this amplifier prior to being digitally encoded and sent to the DSP. The gain of the amplifier is chosen so that it provides a linear gain over the expected operational range. However, in many applications, the analog audio signal generated by the microphone may exceed the dynamic range of the encoder In such a case, the encoded signal will saturate and become distorted. Clearly, this is undesirable because the audio signal will not be able to be acceptably reproduced due to the distortion.

This problem is apparent in digital telephone systems. In many digital telephone systems, the PCM-encoded output of the CODEC is further encoded by a vocoder to minimize the amount of digital data used to represent audio signals. The vocoder employs techniques to compress audio signals such as speech by extracting parameters that relate to a model of human speech. Vocoders are well known in the art. Examples of various vocoder designs may be found in U.S. Pat. No. 5,414,796, entitled "VARIABLE RATE VOCODER," U.S. Pat. No. 5,341,456, entitled "METHOD FOR DETERMINING SPEECH ENCODING RATE IN A VARIABLE RATE VOCODER," and U.S. Pat. No. 5,784,532, entitled "VOCODER ASIC." Each of the above-named patents and applications is assigned to the assignee of the present invention and incorporated herein by reference. If the level of the analog audio signal input to the CODEC is high enough that it causes clipping, then the resultant PCM-encoded speech signal presented to the vocoder will be distorted and the vocoder will not be able to properly model the signal for proper reproduction when decoded. This is commonly called the "loud talker" problem.

In order to overcome the "loud talker" problem, it would be desireable to perform automatic gain control (AGC) on the audio amplifier, turning down the audio amplifier gain when the audio energy level is high, and turning up the audio amplifier gain when the audio energy level is low (i.e., for "soft talkers"). This would allow the CODEC to generate gain-controlled PCM-encoded audio data for use by the vocoder.

However, the vocoder typically estimates the level of background noise (i.e., non-speech components in the PCM-encoded output from the CODEC) and uses this estimated background noise level to perform background noise suppression. If the vocoder is presented with a gain-controlled input signal from the CODEC, then the background noise level will be changing according to how loudly the user is talking. This introduces inaccuracies into the background noise level estimation process.

Thus, what is needed is an automatic gain control circuit which overcomes the "loud talker" problem without introducing inaccuracies into the vocoder's background noise level estimation process.

SUMMARY OF THE INVENTION

The present invention is a novel and improved audio band processor and a method and circuit for controlling the gain of the audio band processor. In the preferred embodiment, the audio band processor comprises a first variable gain amplifier for receiving an analog audio signal; an analog to digital converter for converting said analog audio signal to a digital audio signal; and an interface circuit for encoding said digital audio signal. The interface circuit also arranges said digital audio signal into a sequence of encoded transmit frames, and receives a sequence of encoded receive frames, each receive frame comprising a predetermined number of encoded digital audio signal data bits and a predetermined number of digital gain control bits. The interface circuit also adjusts a gain level of said first variable gain amplifier in response to said digital gain control bits. In another embodiment, the audio band processor further comprises a second variable gain amplifier, and the interface circuit adjusts a gain level of said second variable gain amplifier in response to said digital gain control bits.

The novel audio band processor of the present invention may be used in conjunction with a circuit for controlling the gain of the audio band processor. The circuit comprises a first variable gain amplifier in said audio band processor for receiving an analog audio signal; an analog to digital converter in said audio band processor for converting said analog audio signal to a digital audio signal; an interface circuit for encoding said digital audio signal and for arranging said digital audio signal into a sequence of encoded transmit frames; and a vocoder for measuring an energy level of said sequence of encoded transmit frames. The vocoder also generates digital gain control bits in response to said measured energy level, and generates a sequence of encoded receive frames, each receive frame comprising a predetermined number of encoded digital audio signal data bits a predetermined number of padding bits. The vocoder futher multiplexes said digital gain control bits into said padding bits. The interface circuit adjusts a gain level of said first variable gain amplifier in response to said digital gain control bits. A method for using the present invention is also disclosed.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Figure 1:
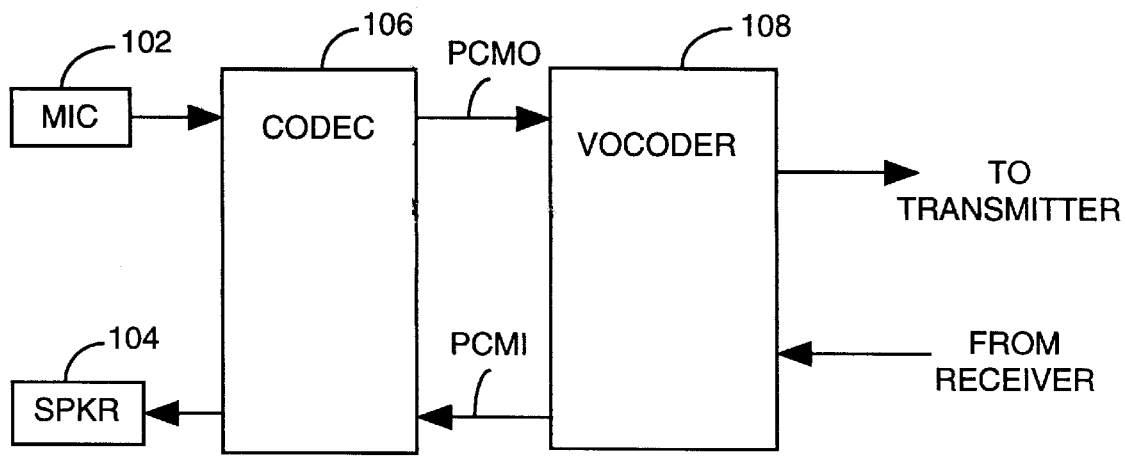
FIG. 1 is a block diagram illustration of an overview of the circuit of the present invention.

Referring now to FIG. 1, a block-diagram overview of the present invention is shown. The elements shown in FIG. 1 are suitable for use in a digital wireless telephone such as a cellular or PCS telephone. Microphone (MIC) 102 is a standard microphone as is known in the art. MIC 102 converts the audio sound waves from the user's speech, as well as background noise, into an analog audio signal. CODEC 106 amplifies and converts the analog audio signal to a PCM-encoded digital audio signal and passes the PCM-encoded digital audio signal over the PCM out (PCMO) line to vocoder 108. It should be noted that CODEC 106 of the present invention may also encode the analog audio signal into different linear or non-linear digital formats as are known in the art.

The vocoder 108 receives the PCM-encoded digital audio signal and performs various digital signal processing techniques such as speech compression, background noise estimation and removal, and voice activity detection. Other digital signal processing techniques are performed by vocoder 108, which is preferably a vocoder designed and constructed in accordance with the above-incorporated U.S. Pat. No. 5,784,532, entitled "VOCODER ASIC." Vocoder 108 then passes frames of vocoded speech data to a transmitter (not shown) for transmission to a wireless base station (not shown).

A receiver (not shown) receives, demodulates, and recovers vocoded speech data from the wireless base station, and passes the frames of vocoded speech data to vocoder 108 for decoding, and reconstruction of the audio data into a PCM-encoded digital audio signal. Vocoder 108 arranges the PCM-encoded digital audio data into PCM receive frames of a predetermined length. Each PCM receive frame generated by vocoder 108 on the receive side comprises a predetermined number of PCM-encoded digital audio data bits, and a predetermined number of padding bits. In the preferred embodiment, the frame length is 16 bits, comprising 13 PCM-encoded digital audio data bits, and 3 padding bits. However, it is clear that other frame lengths and ratios of data to padding bits may be used without departing from the present invention.

CODEC 106 receives the PCM receive frames of PCM-encoded digital audio data, along with the padding bits on the PCM in (PCMI) line. CODEC 106 separates out the padding bits and the PCM-encoded digital audio data bits, and converts the PCM-encoded digital audio data bits to an analog audio signal. The analog audio signal is then converted to audio sound waves by speaker (SPKR) 104. The user is then able to hear the received audio signal.

In the present invention, vocoder 108 also measures the energy level of the PCM-encoded digital audio signal received on the PMCO line. The energy level of this PCM-encoded digital audio signal generated by CODEC 106 is dependent upon the audio level picked up by MIC 102, and by the gain control performed internal to CODEC 106. In response to the measured energy level of the PCM-encoded digital audio signal received on the PCMO line, vocoder 108 generates a digital gain control signal that is inversely proportional to the measured energy level.

In the preferred embodiment, the digital gain control signal is three bits. However, it should be noted that any other number of control bits may be used depending on how much control information is required to be sent. Vocoder 108 multiplexes these digital gain control signal bits into the padding bits of the PCM receive frames discussed above. Thus, in the preferred embodiment, the three padding bits of the frame are replaced by the three digital gain control signal bits. These three digital gain control signal bits are separated out from the frame by CODEC 106 and used to adjust the internal transmit gain.

As can be seen from the above description, the number of control lines and the pin count of the ASICs which perform the CODEC 106 and vocoder 108 functions is reduced by the vocoder 108 multiplexing the digital gain control bits into the PCM receive frames which are already being used to carry PCM-encoded digital audio data. Thus, distortion in the PCM-encoded digital audio signal generated by CODEC 106 is avoided without the need to add any more interfaces between vocoder 108 and CODEC 106. In addition, since it is vocoder 108 itself which is generating the digital gain control signal, it knows, a priori, what the expected change in the internal transmit gain of CODEC 106 will be, and it can therefore account for this gain change in its estimation of background noise.

Figure 2:
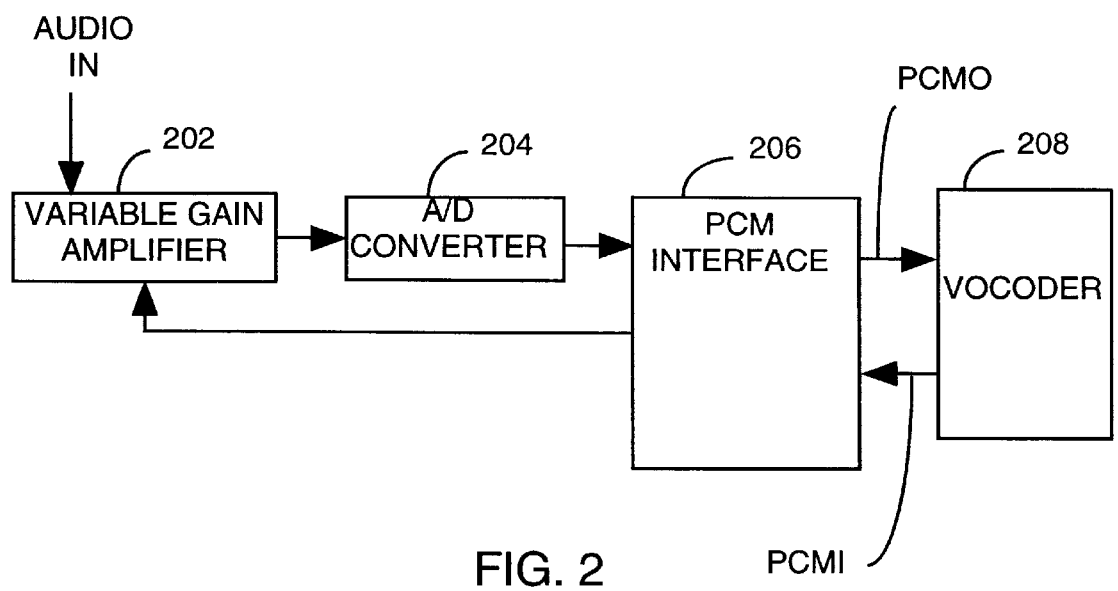
FIG. 2 is an expanded block diagram of the circuit of the present invention.

Referring now to FIG. 2, an expanded block diagram of the circuit of the present invention is illustrated. A variable gain amplifier 202 receives an analog audio signal. Variable gain amplifier 202 amplifies the analog audio signal according to a variable gain value which is set by the digital gain control signal bits generated by vocoder 208, sent over the PCMI line, and separated out by PCM interface 206. A/D converter 204 converts the amplified analog audio signal to a digital audio signal. PCM interface 206 then PCM-encodes the digital audio signal. PCM interface 206 also arranges the PCM-encoded digital audio signal data into a sequence of PCM-encoded transmit frames on the PCMO line and passes the data to vocoder 208 which performs further digital signal processing and energy level measurement.

Figure 3:
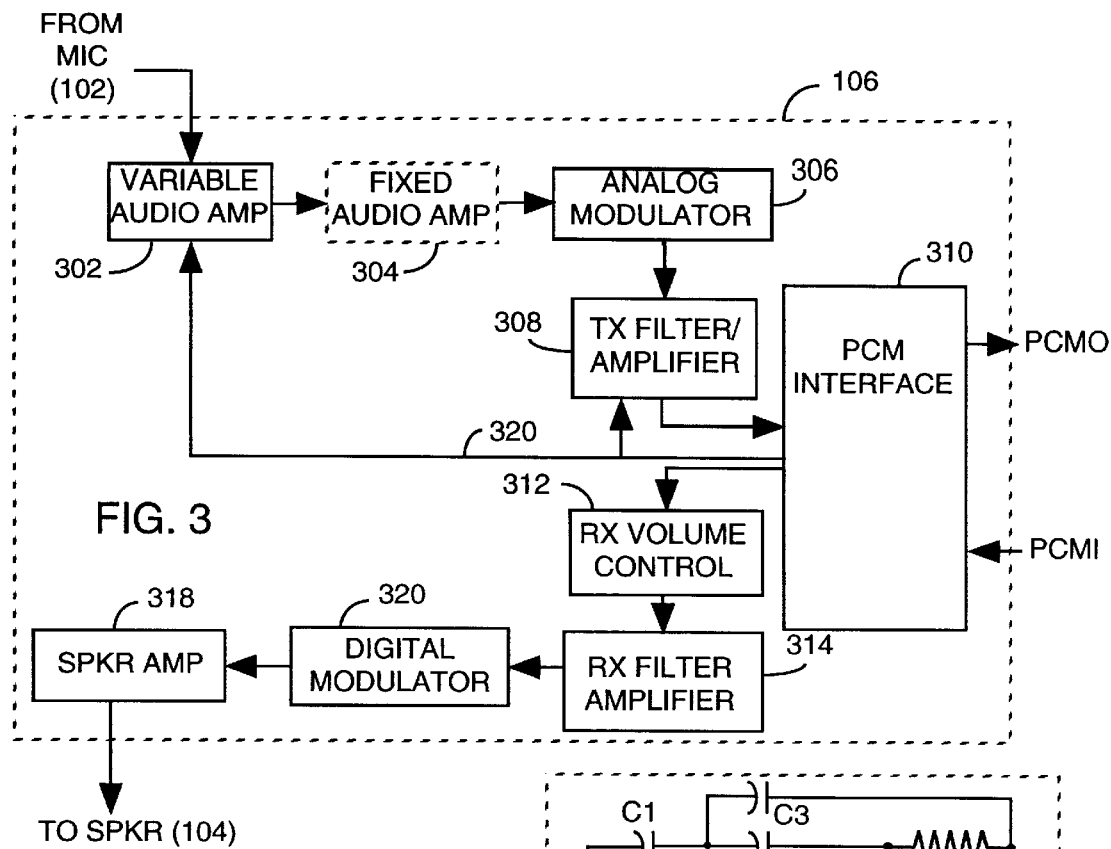
FIG. 3 is a more detailed block diagram of an exemplary embodiment of CODEC of FIG. 2.
Figure 4:
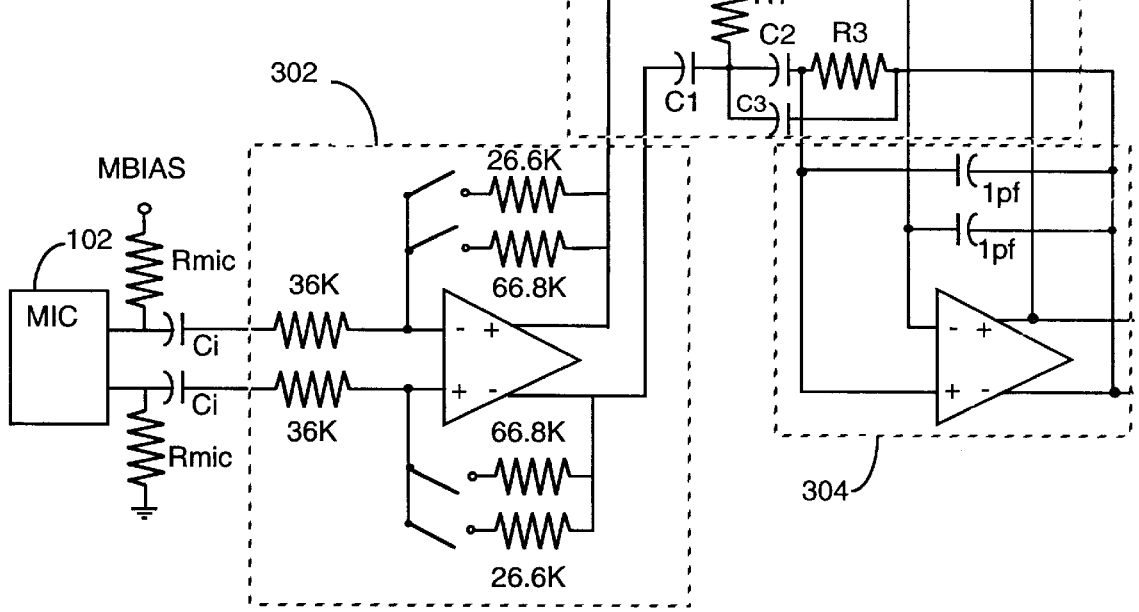
FIG. 4 is a circuit-level diagram of an exemplary variable gain audio amplifier for use with the present invention.

Referring now to FIG. 3, a more detailed block diagram of an exemplary embodiment of CODEC 106 of FIG. 1. is illustrated. On the transmit side, the analog audio signal from MIC 102 is amplified by variable audio amp 302. It may also be additionally amplified by an optional fixed audio amp 304. Analog modulator 206 modulates the amplified, analog audio signal into a digital audio signal, which is then filtered by TX filter and amplifier 308 to remove spurious signal components generated as a by-product of modulation, PCM interface 310 then PCM-encodes the digital audio signal. PCM interface 310 also arranges the PCM-encoded digital audio signal data into a sequence of PCM-encoded transmit frames on the PCMO line the data to vocoder 208 which performs further digital signal processing and energy level measurement.

On the receive side, PCM interface 310 receives the PCM receive frames over the PCMI line. PCM interface 310 de-multiplexes the digital gain control bits from the PCM receive frame and uses the digital gain control bits to control the gain of variable audio amp 302 over control line 320 and TX filter and amplifier 208 over control line 320. In the preferred embodiment, the transmit gain control of CODEC 106 is performed according to the following TABLE I (all gain values in dB):

TABLE I

| Bit Name | | | VARIABLE AMP (302) GAIN | FIXED AMP (304) GAIN | TX FILTER AMP (308) GAIN | AMOD (306) GAIN | TOTAL TX GAIN |
|---|---|---|---|---|---|---|---|
| TP2 | TP1 | TP0 | | | | | |
| 0 | 0 | 0 | 5.38 | 18 | 0 | 0.62 | 24 |
| 0 | 0 | 1 | 5.38 | 18 | −2 | 0.62 | 22 |
| 0 | 1 | 0 | 5.38 | 18 | −4 | 0.62 | 20 |
| 0 | 1 | 1 | 5.38 | 18 | −6 | 0.62 | 18 |
| 1 | 0 | 0 | −2.62 | 18 | 0 | 0.62 | 16 |
| 1 | 0 | 1 | −2.62 | 18 | −2 | 0.62 | 14 |
| 1 | 1 | 0 | −2.62 | 18 | −4 | 0.62 | 12 |
| 1 | 1 | 1 | −2.62 | 18 | −6 | 0.62 | 10 |

From TABLE I, it is evident that in the preferred embodiment, the total transmit gain of CODEC 106 is adjustable from 10 dB (for a loud talker or environment) to 24 dB (for a quiet talker or environment) in 2 dB steps by adjusting the gain of variable audio amp 302 and TX filter and amplifier 308. Clearly, other ranges and dB step values are possible without deviating from the present invention.

The PCM-encoded digital audio signal bits in the PCM receive frame are separated out and decoded by PCM interface 310 and passed to RX volume control 312 where they are gain adjusted, and then filtered and amplified by RX filter and amplifier 314. The decoded digital audio signal is then digitally demodulated by digital modulator 320 and converted into an analog audio signal which is amplified by speaker amplifier (SPKR AMP) 318 for use by speaker 104 (FIG. 1).

An exemplary circuit diagram for the variable audio amp 302 and fixed audio amp 304 is shown in FIG. 3. It should be noted that FIG. 3 is provided as an example and that one skilled in the art would easily be able to modify its teachings to design a slightly different amplifier chain without departing from the present invention. It also should be noted that although variable audio amp 302 and fixed audio amp 304 are shown in FIG. 3 as being differential amplifiers, the circuit depicted in FIG. 3 could also be redesigned as a single-ended circuit without departing from the present invention. Passive network 402 may also be altered to change the gain of fixed audio amp 304. In the preferred embodiment, the passive network 402 is external to CODEC 106 so that the gain of fixed audio amp 304 may be set externally for different applications. In the example of TABLE I above, the fixed audio amp 304 gain is set to 18 dB by passive network 402. Exemplary values for the passive components of FIG. 3 are as follows:

TABLE II

| Component | Typical Value |
|---|---|
| R1 | 10 K ohms |
| R2 | 500 K ohms |
| R3 | 180 K ohms |
| C1 | 0.1 μf |
| C2 | 0.1 μf |
| C3 | 12.3 nf |
| Ci | 0.022 μf |

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

We claim:

1. A circuit for controlling the gain of an audio band processor, the circuit comprising:

a first variable gain amplifier in said audio band processor for receiving an analog audio signal;

an analog to digital converter in said audio band processor for converting said analog audio signal to a digital audio signal;

an interface circuit for encoding said digital audio signal and for arranging said digital audio signal into a sequence of encoded transmit frames; and a vocoder for measuring an energy level of said sequence of encoded transmit frames, and for generating digital gain control bits in response to said measured energy level, and for generating a sequence of encoded receive frames, each receive frame comprising a predetermined number of encoded digital audio signal data bits and a predetermined number of padding bits, and for replacing said padding bits with said digital gain control bits;

wherein said interface circuit adjusts a gain level of said first variable gain amplifier in response to said digital gain control bits.

2. The circuit of claim 1 further comprising a second variable gain amplifier and wherein said interface circuit adjusts a gain level of said second variable gain amplifier in response to said digital gain control bits.

3. A method for controlling the gain of an audio band processor having a first variable gain amplifier, the method comprising the steps of:

receiving an analog audio signal;

converting said analog audio signal to a digital audio signal;

encoding said digital audio signal;

arranging said digital audio signal into a sequence of encoded transmit frames;

measuring an energy level of said sequence of encoded transmit frames;

generating digital gain control bits in response to said measured energy level;

generating a sequence of encoded receive frames, each receive frame comprising a predetermined number of encoded digital audio signal data bits and a predetermined number of padding bits;

replacing said padding bits with said digital gain control bits; and adjusting a gain level of said first variable gain amplifier in response to said digital gain control bits.

4. The method of claim 3 further comprising the step of adjusting a gain level of a second variable gain amplifier in response to said digital gain control bits.

* * * * *